United States Patent [19]

Eizenberg et al.

[11] Patent Number: 4,980,751
[45] Date of Patent: Dec. 25, 1990

[54] ELECTRICAL MULTILAYER CONTACT FOR MICROELECTRONIC STRUCTURE

[75] Inventors: Moshe Eizenberg, Kiryat - Ata, Israel; King-Ning Tu, Chappaqua, N.Y.

[73] Assignee: International Business Machines Corporation, Armonk, N.Y.

[21] Appl. No.: 383,224

[22] Filed: Jul. 19, 1989

Related U.S. Application Data

[63] Continuation of Ser. No. 619,236, Jun. 11, 1984, abandoned, which is a continuation of Ser. No. 305,563, Sep. 25, 1981, abandoned.

[51] Int. Cl.$^5$ .............................................. H01L 23/48
[52] U.S. Cl. ...................................... 357/67; 357/71; 437/189
[58] Field of Search ..................... 357/67, 71; 437/189, 437/190, 192, 194, 201

[56] References Cited

U.S. PATENT DOCUMENTS

3,290,127  12/1966  Kahng et al.
3,906,540  9/1975  Hollins.

OTHER PUBLICATIONS

P. S. Ho et al, "Improved Thermal Stability in Al/-Silicide/Si Junctions," IBM Technical Disclosure Bulletin, vol. 21, No. 8, Jan. 1979, p. 3372.

P. S. Ho et al, "Stable Junctions Between GaAs Semiconductors and Metal Contacts Using a Metallic Compound as a Diffusion Barrier," IBM Technical Disclosure Bulletin, vol. 21, No. 4, Sep. 1978, p. 1752.

P. S. Ho et al, "Stable Junctions Between GaAs and Metal Contacts Using Transition Metals as Diffusion Barriers," IBM Technical Disclosure Bulletin, vol. 21, No. 4, Sep. 1978, p. 1753.

J. Gniewek et al, "Three Barrier Height SBD Process," IBM Disclosure Bulletin, vol. 20, No. 3, Aug. 1977, p. 1001.

L. Berenbaum et al, "Low Temperature In Situ Sputter Process for Schottky Barrier Diodes," IBM Technical Disclosure Bulletin, vol. 20, No. 11A, Apr. 1978, p. 4384.

J. W. Mayer et al, "Silicide Formation with Pd-V Alloys and Bilayers," J. Appl. Phys. 50(9), Sep. 1979, pp. 5855–5859.

J. O. Olowolafe et al, "Contact Reaction Between Si and Pd-W Alloy Films," J. Appl. Phys. 50(10), Oct. 1979, pp. 6316–6320 (Al/W/Pd$_2$Si/Si).

G. Ottaviani et al, "Phase Separation in Alloy-Si Interaction," Appl. Phys. lett. 36(4), 15 Feb. 1980, pp. 331–333.

J. O. Olowolofe et al, "Shallow Silicon Contact and Diffusion Barrier Formed by Phase Separation," IBM Technical Disclosure Bulletin, vol. 22, No. 9, Feb. 1980, p. 4251.

K. N. Tu et al, "Shallow Silicide Contact," J. Appl. Phys. 51(3), Mar. 1980, pp. 1663–1668.

J. M. Poate et al, "Analysis of Thin Films and Interfaces," Physics Today, May 1980, pp. 34–38.

K. N. Tu, "Shallow and Parallel Silicide Contacts," J. Vac. Sci. Technol., 19(3), Sep./Oct. 1981, pp. 766–777.

*Primary Examiner*—Andrew J. James
*Assistant Examiner*—Mark Prenty
*Attorney, Agent, or Firm*—J. David Ellett, Jr.

[57] ABSTRACT

An electrical contact between two film members that is stable over all conditions encountered in processing and over the device lifetime. The contact has a central multi-element diffusion barrier alloy layer having at least one elemental ingredient that does not react with either film member and at least one other elemental ingredient that reacts with the adjacent film member to form an intermediate layer between the diffusion barrier layer and each film member. A contact between aluminum wiring and silicon devices on an integrated circuit chip is provided with a diffusion barrier layer of for example, WPd with an intermediate layer on both sides, one side being PdSi next to the silicon and the other being AlPd$_3$ next to the aluminum.

16 Claims, 6 Drawing Sheets

BEFORE ANNEALING

FIG. 5.1
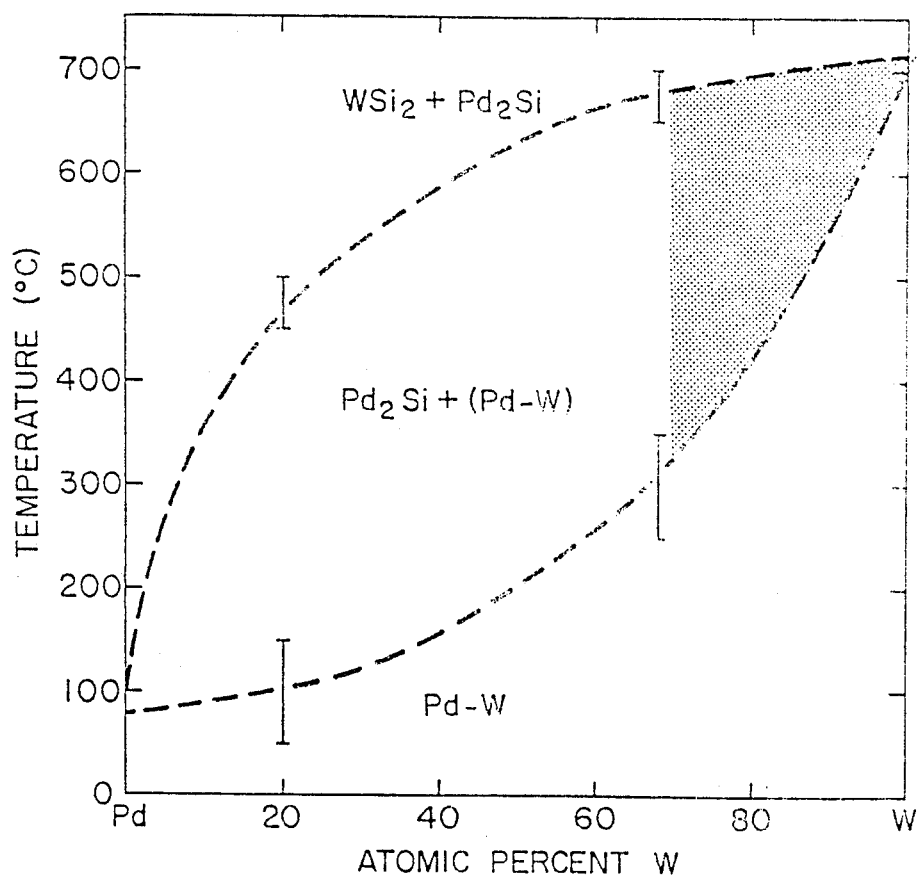

FIG. 5.2
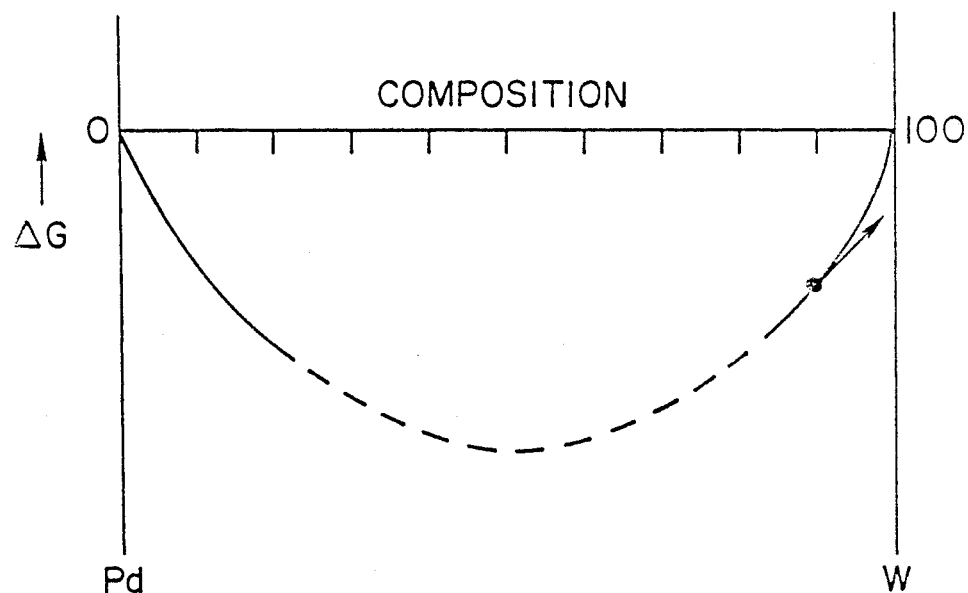

ELECTRICAL MULTILAYER CONTACT FOR MICROELECTRONIC STRUCTURE

This is a continuation of application Ser. No. 06/619,236, filed June 11, 1984 now abandoned, which in turn is a continuation of application Ser. No. 06/305,563, filed Sept. 25, 1981 and now abandoned.

TECHNICAL FIELD

The invention relates generally to an electrical contact for an electronic device and particularly to a multilayer contact for a solid state microelectronic structure.

BACKGROUND ART

Diffusion barriers have been used in thin film microelectronic structures where unwanted interaction between neighboring layers occurs. A notable case is the Al contact to Si. The interaction between Al and Si produces an Al penetration problem. To deal with the problem, a silicide layer is introduced between the Al the Si to serve as a diffusion barrier as well as a contact layer to Si. However, Al reacts quite easily with the silicide which still tends to defeat the purpose thereof. Hence, a second diffusion barrier, usually a refractory metal film such as Cr, has been added between the Al and the silicide. This remedy possesses the fundamental shortcoming that the multi-layered thin film structure is not at thermodynamic equilibrium. It depends on sluggish kinetics to achieve the effect of barrier. The interaction between Al and Si is slowed down, thereby buying more time before device impairment or failure. Therefore, there will be always a doubt about long term stability or reliability in the device. Structures of Al/Cr/PtSi/Si are known to fail.

SUMMARY OF THE INVENTION

It is an object of this invention to produce a near-equilibrium multilayer thin film structure for metallization in electronic devices.

It is another object of this invention to fabricate a thermodynamically stable diffusion barrier for metallization applications in microelectronics.

It is another object of this invention to achieve a near-equilibrium shallow contact for a microelectronic structure.

It is another object of this invention to achieve a thermodynamically stable diffusion barrier within a metal to metal contact (or joint) in a microelectronic structure.

It is another object of this invention to achieve a thermodynamically stable multilayered thin film structure for resisting electromigration.

It is another object of this invention to produce a thermodynamically stable shallow silicide contact for a microelectronic silicon device.

Thermodynamics inevitably causes at some time interdiffusion and/or reaction between neighboring layers. However, the interdiffusion and/or reaction will eventually stop when the system reaches equilibrium. However, before the system reaches its end state, the intermediate states will usually be unacceptable. Even the end state may be unacceptable for the required performance of a device. Optimally, although the interfacial reaction cannot be prevented from occurring, it can be caused to happen in a way which is advantageous.

The following are three aspects of this invention:

(1) A guided interfacial reaction which is to finish soon and to result in the formation of an equilibrium (or near equilibrium in actual practice) diffusion barrier. Heretofore, all diffusion barriers involved stopping or slowing down interfacial reactions.

(2) The design which can achieve the guided interfacial reaction for a multilayer contact on a microelectronic structure; and (3) The forming of a stable diffusion barrier between Al and Si.

Illustratively, for a diffusion barrier between A and B, the exemplary barrier layer in accordance with the principles of this invention is an alloy of $M_xN_y$ satisfying the following criteria:

(1) M is an element which reacts with both A and B to form compounds.

(2) However, N does not react with either A or B in compound formation in the presence of M.

(3) A low mutual solid solubility of M and N is desirable. N-A and N-B eutectic systems are suitable for N and M. The composition of the alloy is preferably rich in N. The alloy can be made by codeposition or sputtering with the sandwich structure of $A/M_xN_y/B$ being made in one pump-down without breaking vacuum. Thermal annealing is introduced after all three layers are deposited.

BRIEF DESCRIPTION OF THE DRAWINGS

FIG. 5.1 shows a schematic map of silicide formation temperature versus composition for the Pd-W system.

FIG. 5.2 is a graph of free-energy versus composition of the reaction thermodynamics in forming a silicide between Si and a transition metal alloy to illustrate theory of the invention.

PRACTICE OF THE INVENTION

Figure 1:
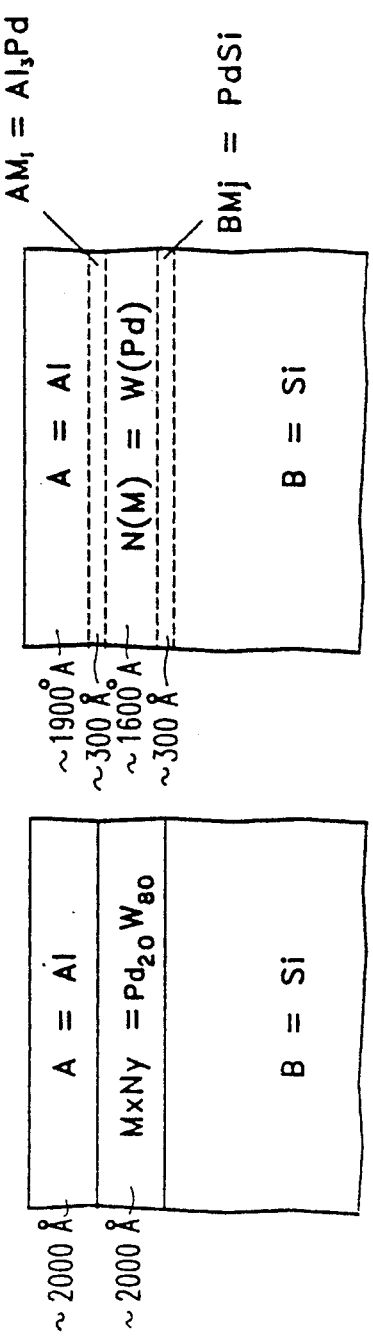
FIG. 1 is a line sketch illustrating the components and configurations for a contact for the practice of this invention.
Figure 2:
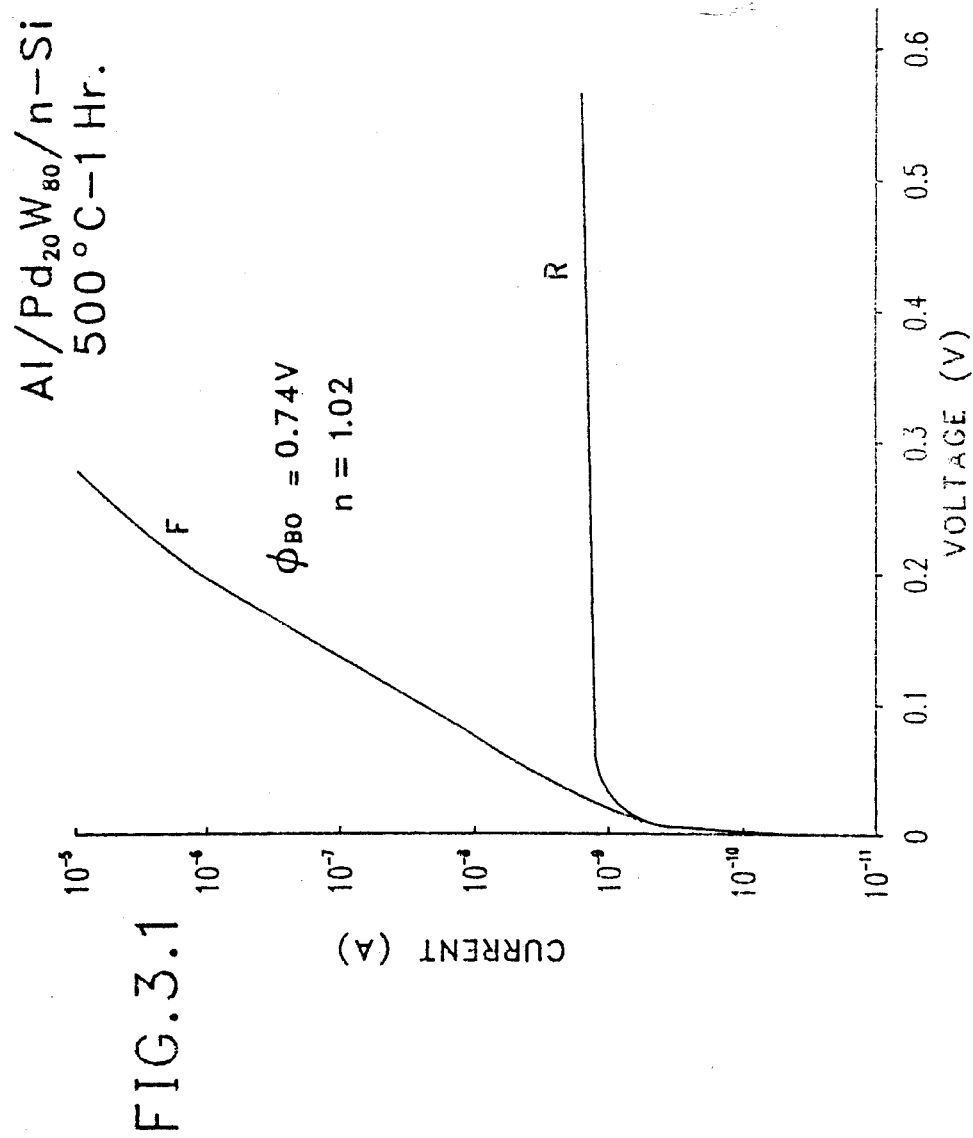
FIG. 2 is a line sketch illustrating the characteristics of the multilayer contact obtained by annealing the structure of FIG. 1 in accordance with the principles of this invention.

FIG. 1 shows a schematic of a structure in accordance with the principles of this invention. A thermal annealing produces reactions between A and the alloy $M_xN_y$ and between $M_xN_y$ and B, where x and y are the composition of M and N in the alloy, thereby, as shown in FIG. 2 forming compounds $AM_i$ and $BM_j$, where i and j denote the exact composition of AM and BM compounds, respectively. The extent of these reactions can be controlled by tailoring the concentration of M in the alloy. Nevertheless, all M cannot be depleted from N(M) because of entropy of mixing and equilibrium will be reached when the compound formation energy equals the partial molar free energy of M in N. In most cases where $AM_i$ and $BM_j$ have a different formation energy, a gradient of M in N exists, but the chemical potential of M across N will be the same. In FIG. 2, where the interfaces are indicated by dotted lines, each pair of the phases across any one of the interfaces are at equilibrium. These interfaces are reacted interfaces. Their reactions are arrested because of the limited amount of M and also because N does not react with A and B. Therefore, the diffusion barrier consists of the compounds and the N(M) layers.

Figure 3:
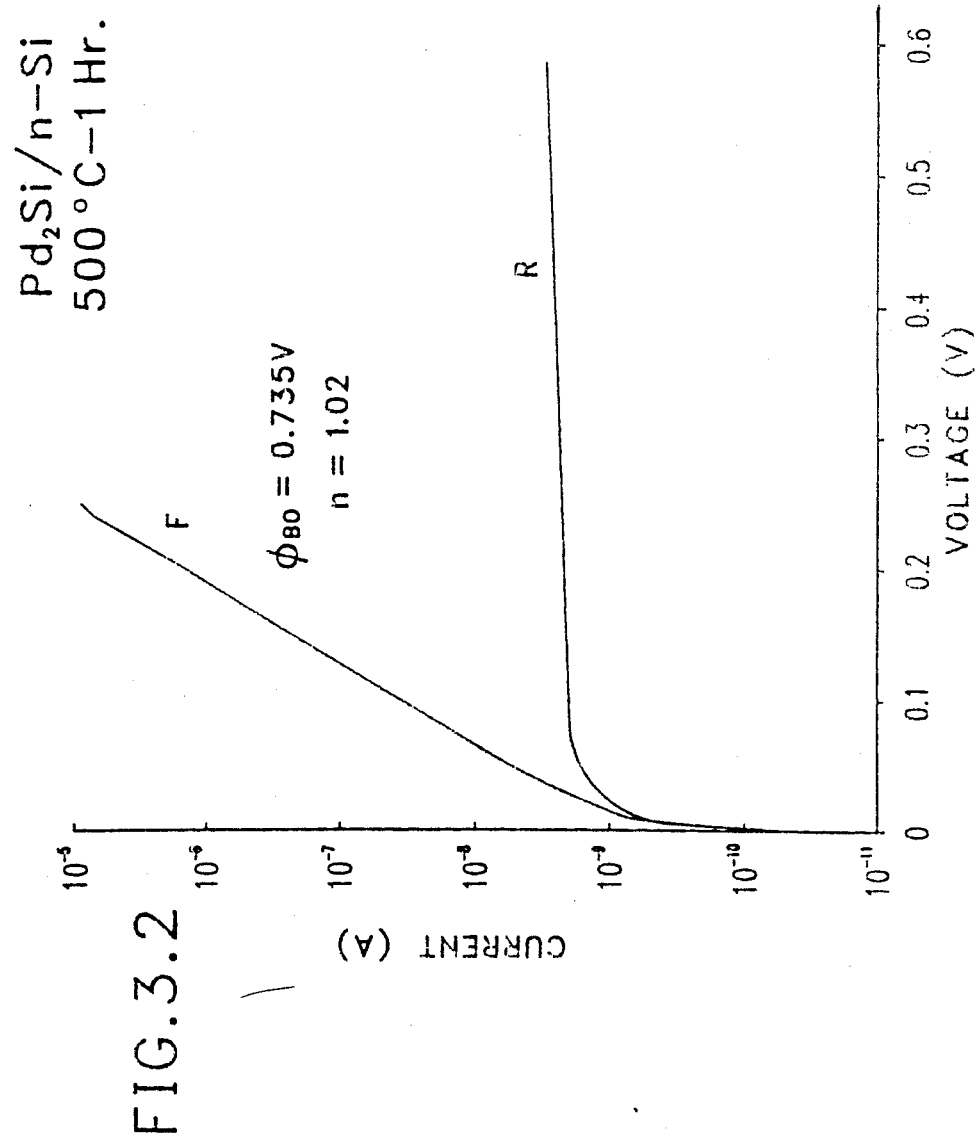
FIGS. 3.1 and 3.2 show data curves for current versus voltage for forward (F) and reversed (R) I-V measurements of and $Al/Pd_{20}W_{80}/n$-Si, and $Pd_2Si/n$-Si respectively.

For the case of Al on Si, a sandwich structure of Al/Pd$_{20}$W$_{80}$/n-Si was deposited. The depositions were carried out at 100° C. The thickness was 2000 Å for each layer of the Al and of the alloy. The sandwich structure was then annealed at 400° C.-1 hr., 500° C.-1 hr., 400° C.-1 hr. plus 500° C.-1 hr. It was found by both forward and reverse I-V measurements of Schottky barrier height of the contact that there was essentially the same barrier height and electrical characteristics as that of a single layer of Pd$_2$Si on n-Si, as shown by the FIGS. 3.1 and 3.2, comparison curves of I-V measurements. A structure of Al/Pd$_2$Si/Si will not survive these heat treatments.

In addition to producing a stable diffusion barrier, there are several other advantages obtained through the practice of this invention. First, a shallow silicide contact is produced. Second, since no annealing exists before the Al-deposition, the unwanted pattern of Al and alloy can be removed by the well known lift-off technique in one step. Third, since Pd reacts on both sides, a° thicker alloy layer can be used which in turn means a thicker W(Pd) for the barrier layer. Practice of this invention is applicable to other contacts to Si, to other semiconductors, to other metallization such as Au instead of Al, and to a diffusion barrier in general.

Figure 4:
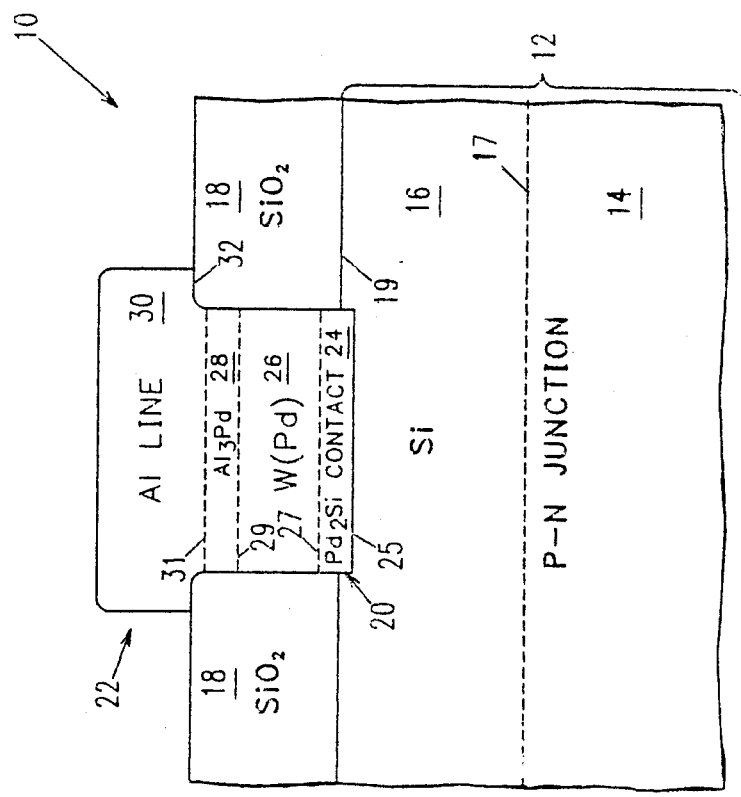
FIG. 4 is a cross-sectional view of a microelectronic structure with a multilayer electrical contact in accordance with the principles of this invention.

FIG. 4 shows a schematic cross-sectional view of a silicon semiconductor microelectronic structure provided by the practice of this invention in accordance with the principles thereof enunciated hereinbefore. Structure 10 comprises a silicon substrate 12 with p-Si portion 14 and n-Si portion 16 with p-n junction 17 therebetween. Upon silicon substrate 12, there is an insulator layer 18 of SiO$_2$ at interface 19 of n-Si portion 16 with opening 20 therein to n-Si portion 16. The multilayer contact 22 is established in opening 20 by the annealing procedure of this invention. Layer 24 comprises a Pd$_2$Si contact to the n-Si portion 16. Interface 25 of the Pd$_2$Si contact 24 with the n-Si portion 16 is below interface 19 of SiO$_2$ layer 18 and n-Si portion 16, as a consequence of the formation reaction described hereinbefore, particularly with reference to FIGS. 1 and 2.

The remainder of the multilayer contact 22 comprises: a W(Pd) layer 26 adjacent to a Pd$_2$Si contact 24 at interface 27; an Al$_3$Pd layer adjacent to the W(Pd) layer 26 at interface 29; and an Al line 30 adjacent to the Al$_3$Pd layer 28 at interface 31. The Al line 30 extends from opening 20 onto the SiO$_2$ layer 18 and overlaps the edge as illustrated at 32.

The multilayer contact 22 in conjunction with the silicon substrate 12 and SiO$_2$ layer 18 has the features and advantages presented hereinbefore for a multilayer contact for a microelectronic structure in accordance with the principles of this invention.

CONSIDERATION FOR THE INVENTION

FIG. 5.1 shows a schematic map of silicide formation temperature vs composition for the Pd-W system. The thermodynamics of a reaction in forming a silicide between Si and a transition metal alloy from the shaded area in FIG. 5.1 will now be considered with the Pd$_{10}$W$_{90}$ alloy as the example.

The reaction at 400° C. can be formulated by the expression

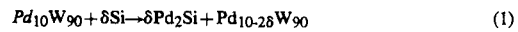

$$Pd_{10}W_{90} + \delta Si \rightarrow \delta Pd_2Si + Pd_{10-2\delta}W_{90} \quad (1)$$

FIG. 5.2 is a graph of free-energy versus composition of the reaction thermodynamics in forming a silicide between Si and a transition metal alloy to illustrate theory of the invention. In terms of free energy change, the reaction expression is represented by the arrow shown in FIG. 5.2 and is expressed by

$$\Delta \overline{G}_{Pd\text{-}W}^{Pd} + G_{Si} \leq (G_{Pd_2Si}) \quad (2)$$

The arrow shows that to deplete Pd from the W-rich alloy will increase free energy. The increment is the partial molar free energy change $\Delta \overline{G}$ in Pd-W alloy at the composition. The driving force is the gain (decrease) in free energy ($G_{Pd_2Si}$) in forming Pd$_2$Si. Since $\Delta \overline{G}_{Pd\text{-}W}^{Pd}$ increases rapidly as the amount of Pd in the alloy decreases, not all Pd can be depleted out. Eventually, the reaction stops and the system reaches equilibrium.

However, the equilibrium depends on temperature since at higher temperatures the W will react with Si to form WSi$_2$. So, the two-layer structure obtained at the lower temperature is metastable. The metastable structure obtained by phase separation is compared to the unstable structure obtained by a sequential deposition of a pure W onto Pd$_2$Si which was first formed by deposition and reacting Pd with Si. The unstable structure has the W as a diffusion barrier heretofore in a device for preventing the unwanted reaction between interconnection metallization and contact metallization.

Illustratively, in a structure of Al/W/Pd$_2$Si/Si, the W is the diffusion barrier for preventing Al-Pd$_2$Si reaction. This layered structure is thermodynamically unstable and interdiffusion and reaction occur upon annealing.

A thermodynamically stable thin film structure is advantageous in thin film applications in various devices. Without breaking vacuum, a bilayer thin film structure of Si/Pd$_{20}$W$_{80}$ Si may be formed where the first Si is a film and the second Si is a substrate. Annealings at 500° C. will produce Si/Pd$_2$Si/W(Pd),/Pd$_2$Si/Si which is comparable to the composition shown in FIG. 5.1 combined with its mirror image. This is a stable structure because the annealing has driven the structure towards equilibrium and the driving force decreases with increasing annealing. It is near-equilibrium, depending on the amount of annealing. The Si film can be replaced by an Al film (Al/Pd$_{20}$W$_{80}$/Si); both Si layers can be replaced by Al films (Al/Pd$_{20}$W$_{80}$/Al; and the alloy can be exchanged with Al film (Pd$_{20}$W$_{80}$/Al/Pd$_{20}$W$_{80}$). Upon annealing, these layered structures will reach a near-equilibrium state. The structure of Al/Pd$_{20}$W$_{80}$/Si can be used as a contact to Si as illustrated by FIG. 4. The Al/Pd$_{20}$W$_{80}$/Al or Pd$_{20}$W$_{80}$ can be used as interconnecting lines to improve electromigration since the diffusion barrier will prevent the formation of openings across the line.

Having thus described our invention, what we claim as new, and desire to secure by Letters Patent is:

1. In a microelectronic device, an essentially-equilibrium multilayer thin-film structure for metallization, comprising:
   (a) a B substrate, which substrate includes an active region of the microelectronic device;
   (b) a first layer comprising a BM$_j$ compound formed on the B substrate;

(c) a second layer comprising an N(M) solid solution formed on the first BM$_j$-compound layer;
(d) a third layer comprising an AM$_i$ compound formed on the second N(M)-solid-solution layer; and
(e) a fourth layer comprising an A metal formed on the third AM$_i$-compound layer;

wherein:

A is a metal;

B is a semiconductor;

M is an element which reacts with A to form the AM$_i$ compound, where i specifies a compositional ratio of M to A, and which reacts with B to form the BM$_j$ compound, where j specifies a compositional ratio of M to B;

N is a solid-solution-component material which essentially does not react to form compounds with either A or B when it is in the presence of M; and N(M) is a solid solution of M in N.

2. Structure of claim 1 wherein said N and said M have low mutual solid solubility.

3. Structure of claim 2 where said N solid-solution-component material is an element.

4. Structure of claim 3 wherein said N(M) solid solution is an alloy compound M$_x$N$_y$ which is rich in N.

5. Structure of claim 1 wherein
said B comprises Si,
said BM$_j$ comprises Pd$_2$Si,
said N(M) comprises W(Pd),
said AM$_i$ comprises Al$_3$Pd, and
said A comprises Al.

6. Structure of claim 1 wherein after said annealing said layered metallization comprises the following thicknesses:
Pd$_2$Si is approximately 300 Å,
W(Pd) is approximately 1600 Å,
Al$_3$Pd is approximately 300 Å, and
Al is approximately 1800 Å.

7. Structure of claim 2 wherein said layered metallization is a shallow contact for a semiconductor microelectronic structure.

8. Structure of claim 7 wherein
said B comprises Si,
said BM$_j$ comprises Pd$_2$Si,
said N(M) comprises W(Pd),
said AM$_i$ comprises Al$_3$Pd, and
said A comprises Al.

9. Structure of claim 2 wherein said layered metallization is an electromigration resistant thin film structure.

10. Structure of claim 2 wherein said layered metallization comprises a shallow silicide contact for a microelectronic silicon device.

11. An electrical interconnection between an aluminum conductor and a silicon semiconductor device comprising in combination
a diffusion barrier layer of an alloy comprising a refractory metal and at least one non-refractory metal that forms an alloy with silicon and aluminum,
a device interface layer of an alloy of silicon and a non-refractory metal of said barrier layer alloy positioned between said diffusion barrier layer and said silicon semiconductor device, and
a conductor interface layer of an alloy of aluminum and a non-refractory metal of said barrier layer alloy positioned between said diffusion barrier layer and said aluminum conductor.

12. The electrical contact of claim 11 wherein each of said device interface and said conductor interface layers is of a thickness less than the thickness of said diffusion barrier layer.

13. The electrical contact of claim 12 wherein said diffusion barrier layer is of the order of 1600 angstroms and each of said interface layers is of the order of 300 angstroms.

14. The electrical contact of claim 11 wherein said diffusion barrier layer is an alloy of tungsten (W) and palladium (Pd).

15. The electrical contact of claim 14 wherein said alloy is Pd$_{20}$W$_{80}$.

16. The electrical contact of claim 15 wherein said conductor interface layer is PdAl$_3$ and said device interface layer is PdSi$_2$.

* * * * *